US008410709B2

(12) United States Patent
Lin

(10) Patent No.: US 8,410,709 B2
(45) Date of Patent: Apr. 2, 2013

(54) PARALLEL LIGHT-EMITTING CIRCUIT OF PARALLEL LED LIGHT-EMITTING DEVICE AND CIRCUIT BOARD THEREOF

(76) Inventor: Hung Lin, Keelung (TW)

( * ) Notice: Subject to any disclaimer, the term of this patent is extended or adjusted under 35 U.S.C. 154(b) by 131 days.

(21) Appl. No.: 13/172,065

(22) Filed: Jun. 29, 2011

(65) Prior Publication Data

US 2011/0253427 A1 Oct. 20, 2011

Related U.S. Application Data

(62) Division of application No. 12/461,603, filed on Aug. 18, 2009, now Pat. No. 8,324,837.

(51) Int. Cl.

*H05B 37/00* (2006.01)
*H05B 41/00* (2006.01)
*H05K 1/00* (2006.01)

(52) U.S. Cl. ..................... 315/192; 315/185 R; 174/254

(58) Field of Classification Search .................. 315/192, 315/185 R; 257/99, 693, 676, 690; 361/806; 313/500; 174/254

See application file for complete search history.

(56) References Cited

U.S. PATENT DOCUMENTS

| | | | | |
|---|---|---|---|---|
| 7,898,811 | B2 * | 3/2011 | Storey | 361/719 |
| 7,939,846 | B2 * | 5/2011 | Chen et al. | 257/99 |
| 8,174,842 | B2 * | 5/2012 | Ou Yang et al. | 361/782 |
| 2003/0223210 | A1 * | 12/2003 | Chin | 361/806 |
| 2005/0230700 | A1 * | 10/2005 | Stefanov et al. | 257/99 |
| 2008/0254649 | A1 * | 10/2008 | Storey | 439/56 |
| 2009/0045724 | A1 * | 2/2009 | Tagawa et al. | 313/504 |
| 2010/0259928 | A1 * | 10/2010 | Ou Yang et al. | 362/235 |

* cited by examiner

*Primary Examiner* — Thienvu Tran

(74) *Attorney, Agent, or Firm* — Bacon & Thomas, PLLC

(57) ABSTRACT

A circuit board of a parallel light-emitting circuit of parallel LED light-emitting device has an electrical insulation board, two wire patterns and at least two power wires. The two wire patterns are oppositely formed on the electrical insulation board. Each wire pattern is connected to the corresponding power wire and has a matrix main loop having closed loops and a plurality of sub-wires formed inside the corresponding closed loop. A plurality of LEDs are respectively mounted on the corresponding closed loop and electrically connect with the two sub-wires of the two wire patterns. When a DC power supply is inputted to the power wires, a current of the DC power supply uniformly flows through the matrix main loop and the sub-wires, so that the LEDs electrically connected to the corresponding sub-wires receive approximately equal current to further emit light with uniform brightness.

12 Claims, 6 Drawing Sheets

PARALLEL LIGHT-EMITTING CIRCUIT OF PARALLEL LED LIGHT-EMITTING DEVICE AND CIRCUIT BOARD THEREOF

The present invention is a divisional application claiming the benefit of U.S. patent application Ser. No. 12/461,603 filed on Aug. 18, 2009 now U.S. Pat. No. 8,324,837.

BACKGROUND OF THE INVENTION

1. Field of the Invention

The present invention relates to an LED panel lighting device, and more particularly to a parallel light-emitting circuit of a parallel LED light-emitting device and a circuit board thereof.

2. Description of Related Art

Owing to low power and bright luminance in operation, LEDs have been extensively adopted as indicator lamps. Recently, LEDs have been widely applied to the field of lighting equipment. LED components can be almost found in diverse lighting products from backlight modules of LCD panel displays to flash lights, table lamps and so forth. Since lighting equipment must provide stable and uniformly bright light, uniform luminance of larger panels is required.

A conventional LED backlight module includes LED components, light-guide plate, diffuser film, prism film, and so forth to effectively form a light-emitting plane of LED light with uniform brightness. Other products may adopt the conventional backlight module, but absolutely uniform brightness is not required. Therefore, a plurality of LED components can be directly employed as a flat light source of the backlight module. Whereas, regular DC power flows in from one side of a circuit board, so LED components spread all over a plane of the backlight module exhibits uneven brightness.

SUMMARY OF THE INVENTION

The main objective of the present invention is to provide a parallel light-emitting circuit of parallel LED light-emitting device and a circuit board thereof, with which enable LED components to electrically connect to provide a light-emitting surface having a uniform brightness to a LED panel device.

To achieve the foregoing objective, a parallel light-emitting circuit of parallel LED light-emitting device is provided having a plurality of LED components, a DC power terminal connector, a plurality of first wires, a plurality of second wires, a plurality of first current-increasing wires and a plurality of second current-increasing wires.

Each of the plurality of LED components has two electrodes. The DC power terminal connector has two power terminals adapted to connect with an external DC power. One of the two power terminals is a positive voltage terminal, and the other is a negative voltage terminal.

Each of the plurality of first wire has one end connected to one electrode of the corresponding LED component and the other end connected to one of the two power terminals of the DC power terminal connector.

Each of the second wires has one end connected to the other electrode of the corresponding LED component so that all LED components are parallel and connected with the DC power terminal connector.

Each of the first current-increasing wires is connected to the corresponding first wire in connection with multiple LED components to increase a current of the corresponding electrode of the LED components.

Each of the second current-increasing wires is connected to the corresponding second wire in connection with multiple LED components to increase a current of the corresponding electrode of the LED components.

As described above, the LED components of the present invention employ the first wire and the second wire to connect with the DC power terminal connector so as to constitute a parallel connection. Besides, to increase the current value of each LED component, multiple LED components are grouped as one set, and the plurality of first and second wires of the multiple LED components are respectively connected with a first and second current-increasing wires. As a result, the LED components of the parallel light-emitting circuit can acquire higher current and allows the parallel light-emitting circuit to have a uniform current, ensuring that all LED components provide uniform brightness for a light-emitting surface with uniform brightness.

A double-sided circuit board of a parallel LED light-emitting device has an electrical insulation board, a first wire pattern, a second wire pattern, two first power wires and a second power wire.

The electrical insulation board has a body and a connection strip extended from one side of the body, and the body and the connection strip have a top surface and a bottom surface respectively.

The first wire pattern is formed on the top surface of the body and has a first matrix main loop, a plurality of first sub-wires, a plurality of second sub-wires and a plurality of first conducting through holes.

The first matrix main loop is formed by a plurality of closed loops. The plurality of first sub-wires are formed in and connected to each of the closed loops. The plurality of second sub-wires are formed in each of the closed loops and disconnected to the first sub-wires and the corresponding closed loops. The plurality of first conducting through holes are formed through each of the second sub-wires and the body.

The second wire pattern is formed on the bottom surface of the body and has a second matrix main loop, a plurality of third sub-wires.

The second matrix main loop is formed by a plurality of closed loops respectively corresponding to the closed loops of the first matrix main loops. The plurality of third sub-wires are formed in and connected to each of the closed loops of the second matrix main loop, and are connected to the first conducting through holes in the corresponding closed loop of the first matrix main loop, so as to electronically connect to the second sub-wires in the corresponding closed loop of the first matrix main loop through the first conducting through holes.

The two first power wires are formed on the top surface of the connection strip and adapted to connect with an external DC power. One of the two first power wires is directly connected with the first matrix main loop.

The second power wire is formed on the bottom surface of the connection strip, corresponds to a location of the other first power wire on the top surface of the connection strip, is electrically connected with the corresponding first power wire through a plurality of second conducting through holes, and is directly connected with the second matrix main loop.

Each closed loop of the first matrix main loop of the circuit board in accordance with the present invention is electrically connected with the LED component. The plurality of first sub-wires are electrically connected one of the two pins of the LED component. The plurality of second sub-wires are electrically connected with the other pin of the LED component. As the first and second matrix main loop are connected with the power circuits on the connection strip, uniform current flows through the first and second matrix main loops when a DC power is outputted to the power circuits. Also because the plurality of first and second sub-wires are connected to the LED component through each closed loop, sufficient current can be provided to the LED component within each closed loop ensuring that all LED components still maintain sufficient and uniform brightness even when the current is low.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
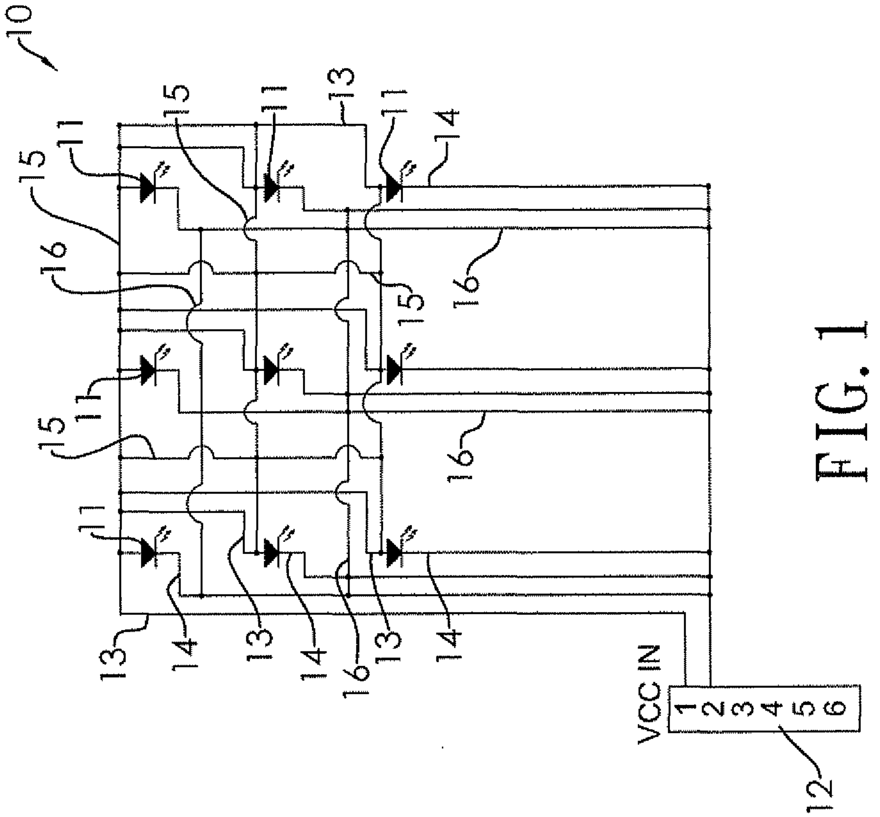
FIG. 1 is a circuit diagram of a parallel light-emitting circuit in accordance with the present invention.
Figure 2A:
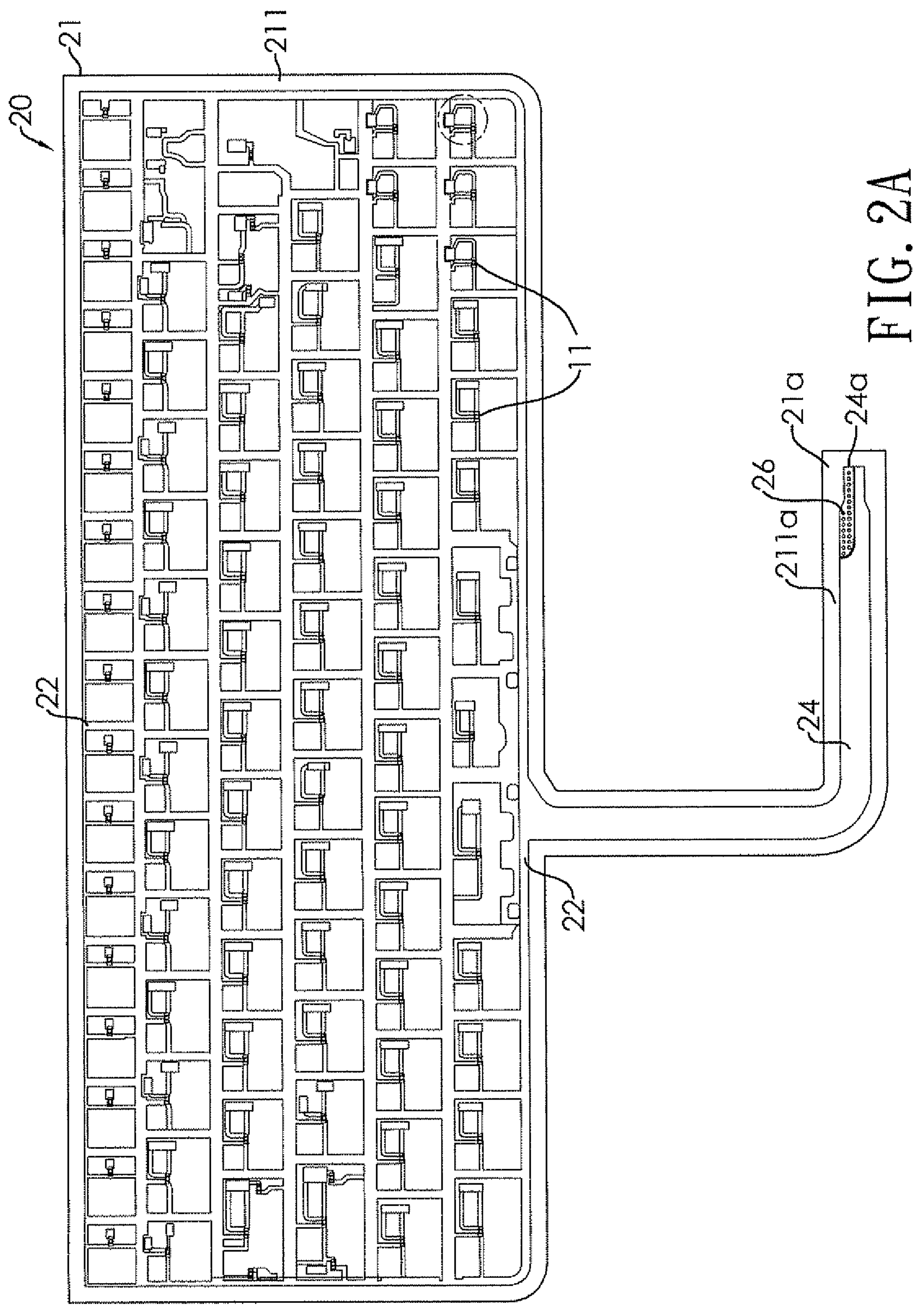
FIG. 2A is a top view of a circuit board in accordance with the present invention.
Figure 2B:
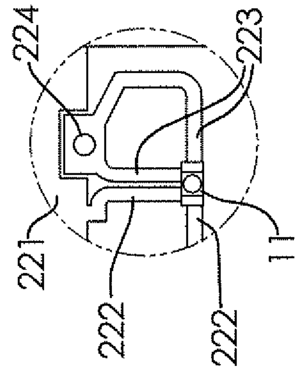
FIG. 2B is a partially enlarged view of FIG. 2A.
Figure 3A:
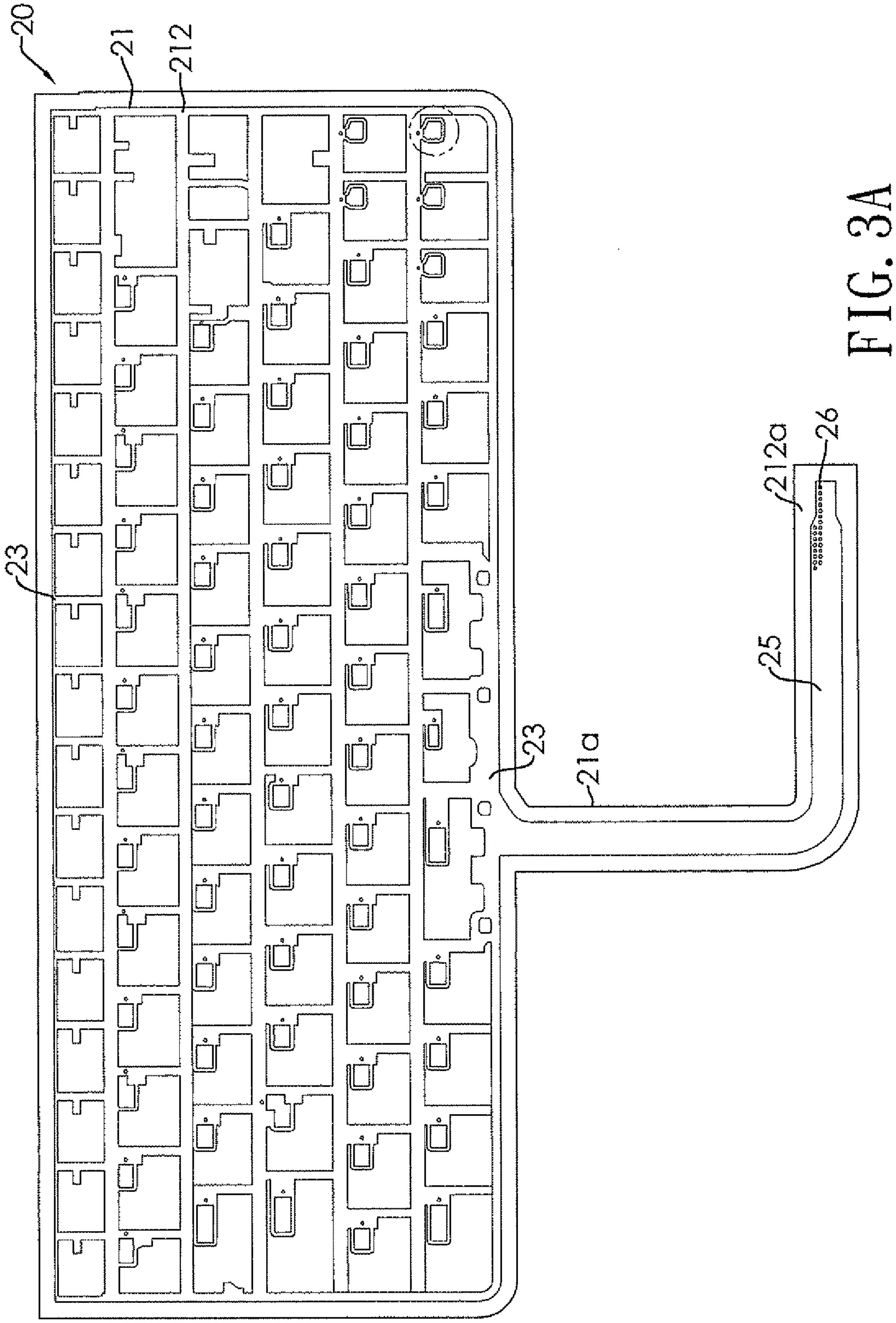
FIG. 3A is a bottom view of the circuit board in accordance with the present invention.
Figure 3B:
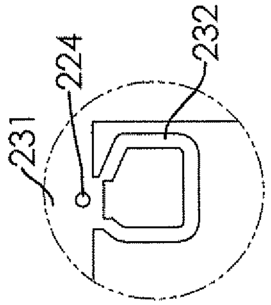
FIG. 3B is a partially enlarged view of FIG. 3A.

With reference to FIG. 1, a parallel light-emitting circuit (10) has a plurality of LED components (11), a DC power terminal connector (12), a plurality of first wires (13), a plurality of second wires (14), a plurality of first current-increasing wires (15) and a plurality of second current-increasing wires (16).

Each of the LED components (11) has two electrodes. In the present embodiment, each of the LED components pertains to an on-chip LED component.

The DC power terminal connector (12) has two power terminals to be connected with external DC power source of which one of the two power terminals is a power terminal with positive voltage and the other is a power terminal with negative voltage.

One end of each of the first wires (13) is connected with one electrode of the LED component (11). The other end is connected to one power terminal of the DC power terminal connector (12). In the present embodiment, the first wire (13) is connected to the power terminal with positive voltage.

One end of each second wire (14) is connected to the other electrode of the LED component (11). The other end is connected to the other power terminal of the DC power terminal connector (12). Therefore, all LED components (11) are connected in parallel to the DC power terminal connector (12). In the present embodiment, the second wire is connected to the power terminal with negative voltage.

Each of the first current-increasing wires (15) is connected with multiple first wires (13) in connection with the corresponding LED components (11) so as to increase the current of the corresponding electrode of the LED component (11).

Each of the second current-increasing wires (16) is connected with multiple second wires (14) in connection with the corresponding LED components (11) so as to increase the current of the corresponding electrode of the LED component (11).

In the present embodiment, the plurality of LED components (11) are aligned in the form of a matrix having a plurality of parallel rows of LED components. Each first and second current-increasing wires (15), (16) are respectively connected with the plurality of first and second wires (13), (14) of the corresponding rows of LED components.

As mentioned earlier, the plurality of LED components of the present invention are individually connected with the DC power terminal connector (12) through the first wire (13) and the second wire (14) to mutually form a parallel connection. To prevent the brightness of the LED components (11) distant from a DC power from deviating from that of the rest of LED components (11) due to excessively small current, several LED components are bundled as one set. In the present embodiment, the LED components aligned in the form of a matrix have three rows in total and three LED components in a row. The plurality of first and second wires (13), (14) of the multiple LED components (11) in a row are respectively connected with a first and second current-increasing wires (15), (16), so that each electrode of each LED component (11) has at least two circuits in connection therewith. As a result, the LED components of the parallel light-emitting circuit of the present invention can acquire a higher current. The parallel light-emitting circuit has a uniform current, making that all LED components have similar brightness to provide a light-emitting panel with uniform brightness.

To further implement a circuit board (20) of the parallel light-emitting circuit in the present invention, with reference to FIG. 2A, FIG. 2B, FIG. 3A and FIG. 3B, the circuit board (20) has an electrical insulation board (21), a first wire pattern, a second wire pattern, two first power wires (24), (**24*a*) and a second power wire (25**).

A connection strip (**21*a*) is extended from one side of a body of the electrical insulation board (21). Both the body and the connection strip (21*a*) have a top surface (211), (211*a*) and a bottom surface (212), (212*a***) respectively. In the present embodiment, the electrical insulation board is a flexible transparent sheet or a rigid printed circuit board.

The first wire pattern is formed on the top surface (211) of the body and has a first matrix main loop (22), a plurality of first sub-wires (222) and a plurality of second sub-wires (223). The first matrix main loop (22) is formed by a plurality of closed loops (221) having the plurality of first sub-wires (222) and the plurality of second wires (223) formed therein. The plurality of first sub-wires (222) are formed in and connected to each of the closed loops (221). The plurality of second sub-wires (223) are formed in each of the closed loops (221) and disconnected to the first sub-wires (222) and the corresponding closed loops (221). A plurality of first conducting through holes (224) are formed through each of the second sub-wires (223) and the body. In the present embodiment, the wire width of the closed loop (221) in the first matrix main loop is wider than that of the first sub-wire (222) and the second sub-wire (223).

The second wire pattern is formed on the bottom surface (212) of the body and has a second matrix main loop (23) and a plurality of third sub-wires. The second matrix main loop (23) is formed by a plurality of closed loops (231). The second matrix main loop (23) is formed by a plurality of closed loops (231) respectively corresponding to the closed loops (221) of the first matrix main loops (22). Each closed loop (231) has a plurality of third sub-wires (232) formed therein. A plurality of third sub-wires (232) are formed in and connected to each of the closed loops (231) of the second matrix main loop (23), and are connected to the first conducting through holes (224) in the corresponding closed loop (221) of the first matrix main loop (22) so as to electronically connect to the second sub-wires (223) in the corresponding closed loop (221) of the first matrix main loop (22) through the first conducting through holes (224). In the present embodiment, the wire width of each closed loop (231) in the second matrix main loop (23) is wider than that of the third sub-wire (232).

The two first power wires (24, 24*a*) are formed on a top surface (211*a*) of the connection strip (21*a*) to connect with external DC power supply. The first power wire (24) located on the upper plane of the connection strip (21*a*) and connected with the first matrix main loop (22) is a high voltage loop, the other first power wire (24*a*) is a low voltage wire.

The second power wire (25) is formed on a bottom surface (212*a*) of the connection strip (21*a*) to correspond to the position of the other power circuit (24*a*) on the top surface (211*a*) of the connection strip (21*a*) and electrically connect with the corresponding first power circuit (24*a*) through a plurality of second conducting through holes (26). The position where the second power wire (25) corresponds to the first power wire (24*a*) on the top surface (211*a*) of the connection strip (21*a*) abuts a free end of the connection strip (21*a*). The second power wire (25) formed on the bottom surface (212*a*) and connected with the second matrix main loop (23) is a low voltage wire.

Figure 4:
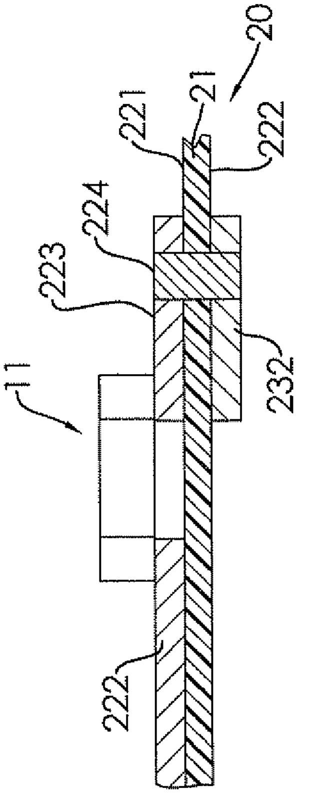
FIG. 4 is a partial cross-sectional view of the circuit board in accordance with the present invention.

The design of the circuit board of the present invention is dedicated to the plurality of LED components (11) electrically connected in parallel and mounted on the top surface (211) of the electrical insulation board (21) in the form of a matrix. Each closed loop of the first matrix main loop (22) is provided to electrically connect with the LED components (11). The plurality of first sub-wires (222) are connected with positive pins of the LED components (11). The plurality of second sub-wires (223) are connected with negative pins of the LED components (11). When a DC power is inputted to the two first power wires (24, 24*a*), with reference to FIG. 4, high-voltage DC power goes through the high voltage power wire (24) on the top surface (211*a*) of the connection strip (22), and low-voltage DC power goes through the low voltage power wire (24*a*) on the top surface (211*a*) of the connection strip (21*a*), a plurality of second conducting through holes (26) and the low voltage power wire (25) on the bottom surface (212*a*) of the connection strip (21*a*) to connect with the second matrix main loop (23) and the third sub-wire (232). The third sub-wire (232) further transmits to the second sub-wire (223) through the first conducting through holes (224) to supply low-voltage power to the LED components (11).

As the first and second matrix main loops (22, 23) are connected with the power circuits (24, 25) on the connection strip (21*a*). From the viewpoint of electrically connecting to the circuit board (20) of the present invention with a single LED component (11), its positive and negative voltage pins are connected to the corresponding first and second matrix main loops (22, 23) via two paths. If adding the wire width of the first matrix main loop (22) can further design a wider width of the first sub-wire (222) and the second sub-wire (223), more uniform current can be formed in the first and second matrix main loops (22, 23). Also because each closed loop provides a plurality of first and second sub-wires in connection with the LED component, sufficient current can be provided to the LED components in each closed loop. As such, despite a low current, all LED components still maintain sufficient and uniform brightness.

The alignment of LED components in a flat light-emitting device or a flat backlight module varies. Speaking of a backlight module of keyboard, as the keys are similarly aligned as a matrix, the electrical insulation board of the double-sided PCB of the embodiment has assembling through holes formed on each closed loop of the first matrix main loop to correspond to the keys, facilitating assembly inside a keyboard and serving as a backlight module. When adopted to serve as a backlight device of a dash board of a vehicle or motorcycle, the first matrix and the second matrix vary their shapes in accordance with the mounting positions of the LED components.

In sum, the parallel light-emitting circuit provided by the present invention improves the drawback of the parallel light-emitting device concerning uneven light-emitting luminance without losing the low power consumption advantage of parallel light-emitting circuit.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A circuit board of a parallel LED light-emitting device, comprising:

an electrical insulation board having a body and a connection strip extended from one side of the body, and the body and the connection strip having a top surface and a bottom surface respectively;

a first wire pattern formed on the top surface of the body and having a first matrix main loop is formed by a plurality of closed loops;

a plurality of first sub-wires formed in and connected to each of the closed loops;

a plurality of second sub-wires formed in each of the closed loops and disconnected to the first sub-wires and the corresponding closed loops; and a plurality of first conducting through holes formed through each of the second sub-wires and the body;

a second wire pattern formed on the bottom surface of the body and having a second matrix main loop is formed by a plurality of closed loops respectively corresponding to the closed loops of the first matrix main loops; and a plurality of third sub-wires formed in and connected to each of the closed loops of the second matrix main loop, and connected to the first conducting through holes in the corresponding closed loop of the first matrix main loop so as to electronically connect to the second sub-wires in the corresponding closed loop of the first matrix main loop through the first conducting through holes;

two first power wires formed on the top surface of the connection strip and adapted to connect with an external DC power, one of the two first power wires is directly connected with the first matrix main loop; and a second power wire formed on the bottom surface of the connection strip, corresponding to a location of the other first power wire on the top surface of the connection strip, electrically connected with the corresponding first power wire through a plurality of second conducting through holes, and directly connected with the second matrix main loop.

2. The circuit board of a parallel LED light-emitting device as claimed in claim 1, wherein a location of the second power wire corresponding to that of the other power circuit on the top surface of the connection strip abuts a free end of the connection strip.

3. The circuit board of a parallel LED light-emitting device as claimed in claim 1, wherein a wire width of the first matrix main loop is wider than that of the first sub-wire and the second sub-wire, and the wire width of the second matrix main loop is wider than that of the second sub-wire and the third sub-wire.

4. The circuit board of a parallel LED light-emitting device as claimed in claim 2, wherein a wire width of the first matrix main loop is wider than that of the first sub-wire and the second sub-wire, and the wire width of the second matrix main loop is wider than that of the second sub-wire and the third sub-wire.

5. The circuit board of a parallel LED light-emitting device as claimed in claim 1, wherein the first power wire located on the top surface of the connection strip and connected with the first matrix main loop is a high voltage loop, the other first power wire is a low voltage wire, and the second power wire formed on the bottom surface and connected with the second matrix main loop is a low voltage loop.

6. The circuit board of a parallel LED light-emitting device as claimed in claim 2, wherein the first power wire located on the top surface of the connection strip and connected with the first matrix main loop is a high voltage loop, the other first power wire is a low voltage wire, and the second power wire located on the bottom surface and connected with the second matrix main loop is a low voltage loop.

7. The circuit board of a parallel LED light-emitting device as claimed in claim 1, wherein the electrical insulation board is a flexible transparent sheet.

8. The circuit board of a parallel LED light-emitting device as claimed in claim 2, wherein the electrical insulation board is a flexible transparent sheet.

9. The circuit board of a parallel LED light-emitting device as claimed in claim 1, wherein the electrical insulation board is a rigid printed circuit board.

10. The circuit board of a parallel LED light-emitting device as claimed in claim 2, wherein the electrical insulation board is a rigid printed circuit board.

11. The circuit board of a parallel LED light-emitting device as claimed in claim 7, wherein assembling through holes are formed within each closed loop of the first matrix main loop of the electrical insulation board.

12. The circuit board of a parallel LED light-emitting device as claimed in claim 8, wherein assembling through holes are formed within each closed loop of the first matrix main loop of the electrical insulation board.

* * * * *